(12) United States Patent
Na

(10) Patent No.: US 6,285,230 B1
(45) Date of Patent: Sep. 4, 2001

(54) INPUT BUFFER CIRCUIT WITH ADJUSTABLE DELAY VIA AN EXTERNAL POWER VOLTAGE

(75) Inventor: Joon-Ho Na, Cheongju (KR)

(73) Assignee: Hyundai Electronics Industries Co., Ltd., Kyoungki-Do (KR)

(*) Notice: Subject to any disclaimer, the term of this patent is extended or adjusted under 35 U.S.C. 154(b) by 0 days.

(21) Appl. No.: 09/544,215

(22) Filed: Apr. 7, 2000

(30) Foreign Application Priority Data

Apr. 7, 1999 (KR) .................................................. 99-12056

(51) Int. Cl.[7] ...................................................... H03H 11/26
(52) U.S. Cl. .......................... 327/277; 327/143; 327/278
(58) Field of Search ..................................... 327/270, 271, 327/272, 276, 277, 278, 284, 285, 393–396, 400, 80, 81, 143, 198, 108, 111, 112; 326/87, 22

(56) References Cited

U.S. PATENT DOCUMENTS

| | | | |
|---|---|---|---|
| 5,121,014 | * 6/1992 | Huang | 327/276 |
| 5,323,360 | 6/1994 | Pelley, III | 365/233.5 |
| 5,497,117 | * 3/1996 | Nakajima et al. | 327/81 |
| 5,680,370 | 10/1997 | Hashimoto et al. | 365/233 |
| 5,768,257 | 6/1998 | Khacherian et al. | 370/229 |
| 6,034,557 | * 3/2000 | Schultz et al. | 327/278 |

* cited by examiner

Primary Examiner—Toan Tran

(57) ABSTRACT

An input buffer circuit compensates for a data hold time and reduces an operational current by implementing a delay operation with transistors having a long channel when the input buffer circuit is driven by a high external voltage. The input buffer circuit includes a delay unit to delay an input signal, the delay unit being powered by an external power voltage and having an associated variable delay which is varied according to a detection signal and the external power voltage, the detection signal indicating whether the external power voltage is high or low.

19 Claims, 4 Drawing Sheets

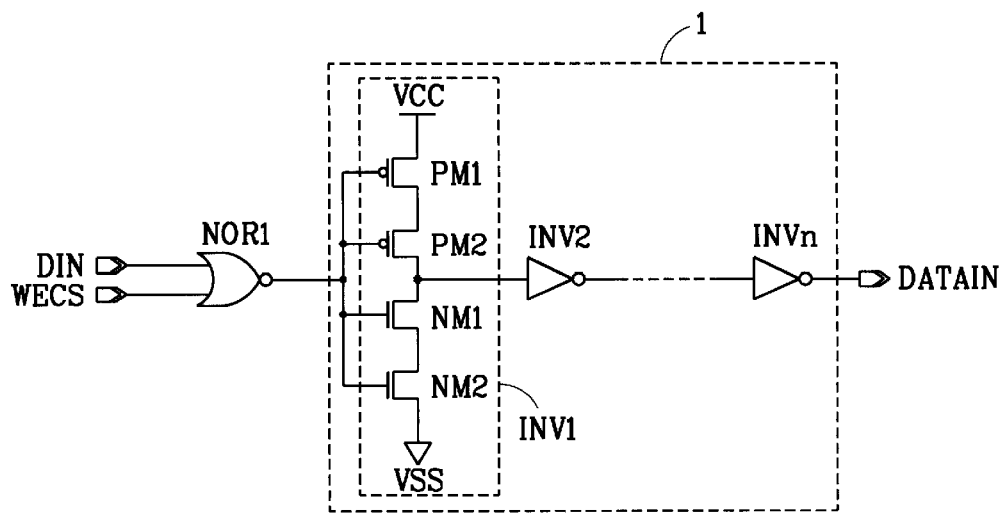
FIG.1
BACKGROUND ART
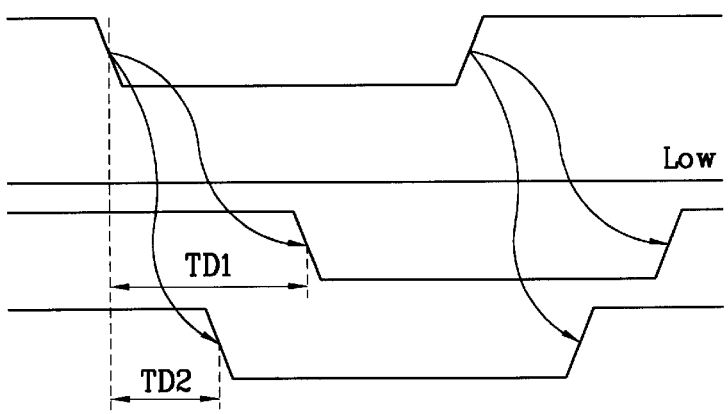
FIG.2A DIN
BACKGROUND ART
FIG.2B WECS
BACKGROUND ART
FIG.2C DATAIN (VCCL)
BACKGROUND ART
FIG.2D DATAIN (VCCH)
BACKGROUND ART

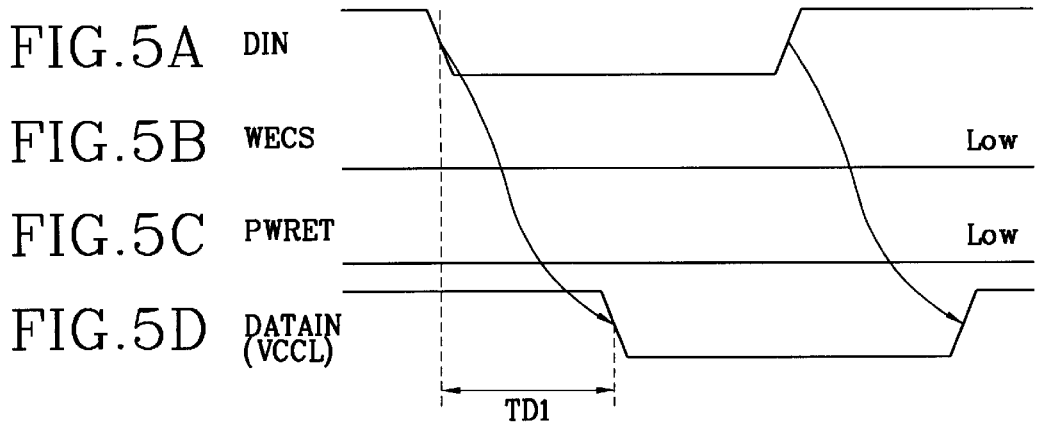
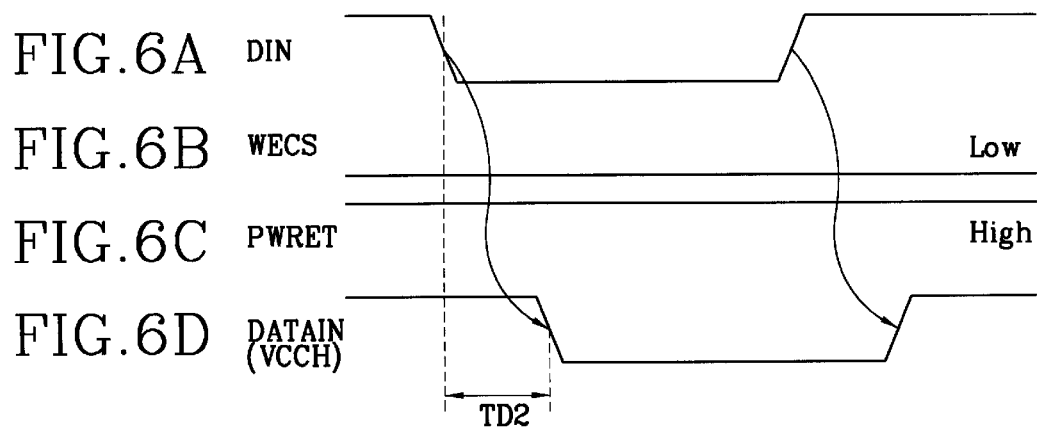

INPUT BUFFER CIRCUIT WITH ADJUSTABLE DELAY VIA AN EXTERNAL POWER VOLTAGE

BACKGROUND OF THE INVENTION

1. Field of the Invention

The present invention relates to an input buffer circuit, and in particular to an input buffer circuit which can compensate for a data hold time and reduce an operational current.

2. Description of the Background Art

FIG. 1 is a circuit diagram illustrating a conventional input buffer circuit 5. Referring to FIG. 1, the input buffer circuit 5 includes: a NOR gate NOR1 NORing a data signal DIN inputted to a data input pad and a control signal WECS into which an enable signal WE and a chip selection signal CS are combined; and a delay unit 1, having first to n-th inverters INV1~INVn delaying an output signal from the NOR gate NOR 1.

The first inverter INV1 of the delay unit 1 includes: first and second PMOS transistors PM1, PM2 and first and second NMOS transistors NM1, NM2 connected in series between an external power voltage VCC and a ground voltage VSS. The gates of PM1, PM2, NM1 and NM2 are commonly connected to form an input terminal receiving an output signal from the NOR gate NOR1, and drains of the second PMOS transistor PM2 and the first NMOS transistor NM1 are commonly connected to form an output terminal outputting an output signal.

Each inverter INV2~INVn−1 is identically constituted to the first inverter INV1, and thus each input terminal is connected to an output terminal of a preceding inverter, and each output terminal is connected to an input terminal of a succeeding inverter.

In addition, the n-th inverter INVn is identically constituted to the first inverter INV 1. Thus, an output signal from a preceding inverter INVn−1 is inputted to its input terminal, and an input data DATAIN is outputted from its output terminal.

The operation of the thusly-constituted input buffer circuit will now be described with reference to FIGS. 2A–2D.

First, when the data signal DIN as shown in FIG. 2A and the low-level control signal WECS as shown in FIG. 2B are inputted, if a low external power voltage VCCL is applied to the input buffer circuit at the inverters'respective VCC terminals, the data signal DIN is delayed by the delay unit 1, and thus outputted as the input data DATAIN as shown in FIG. 2C.

On the other hand, when the data signal DIN as shown in FIG. 2A and the low-level control signal WECS as shown in FIG. 2B are inputted, if a high external power voltage VCCH is applied to the input buffer circuit at the inverters'respective VCC terminals, the data signal DIN is delayed by the delay unit 1, and thus outputted as the input data DATAIN as shown in FIG. 2D.

As illustrated in FIG. 2D, when the delay unit 1 is driven by the high external power voltage VCCH, not the low external power voltage VCCL, a driving current is increased as much as the external power voltage VCC rises. Thus each inverter INV1~INVn operates rapidly. Accordingly, a delay rate is lowered.

When the conventional input buffer circuit 5 is operated by the high external power voltage VCCH during a write operation, one must add more inverters in order to obtain a sufficiently long data hold time. However, when the low external power voltage VCCL is applied, the conventional input buffer circuit is delayed due to the additional inverters. Thus its operational speed becomes slower.

Also, when the delay unit 1 is operated by the high external power voltage VCCH, the driving current is increased.

SUMMARY OF THE INVENTION

Accordingly, the present invention is directed to an input buffer that substantially obviates one or more of the problems due to limitations and disadvantages of the related art.

In accordance with the purpose of the invention, as embodied and broadly described, one aspect the invention includes a delay unit to delay an input signal, the delay unit being powered by an external power voltage and having an associated variable delay which is varied according to a detection signal and the external power voltage, the detection signal indicating whether the external power voltage is high or low.

It is to be understood that both the foregoing general description and the following detailed description are exemplary and explanatory and are intended to provide further explanation of the invention as claimed.

The accompanying drawings are included to provide a further understanding of the invention and are incorporated in and constitute a part of this specification, illustrate one embodiment of the invention and together with the description serve to explain the principles of the invention.

BRIEF DESCRIPTION OF THE DRAWINGS

The present invention will become better understood with reference to the accompanying drawings which are given only by way of illustration and thus are not limitative of the present invention, wherein:

FIG. 1 is a circuit diagram illustrating a conventional input buffer circuit;

FIGS. 2A–2D are operational timing diagrams where an external power voltage is high and low in the configuration of FIG. 1;

FIGS. 5A–5D are operational timing diagrams where a low external power voltage is applied in the configuration of FIG. 3; and FIGS. 6A–6D are operational timing diagrams where a high external power voltage is applied in the configuration of FIG. 3.

DETAILED DESCRIPTION OF THE INVENTION

The present invention provides an input buffer circuit which can obtain a sufficient data hold time and reduce a driving current without requiring an additional inverter, even when a high external power voltage is applied. The present invention does this by employing inverters having different delay rates according to the high or low external power voltage.

An input buffer circuit in accordance with a preferable embodiment of the present invention will now be described in detail with reference to the accompanying drawings.

Figure 3:
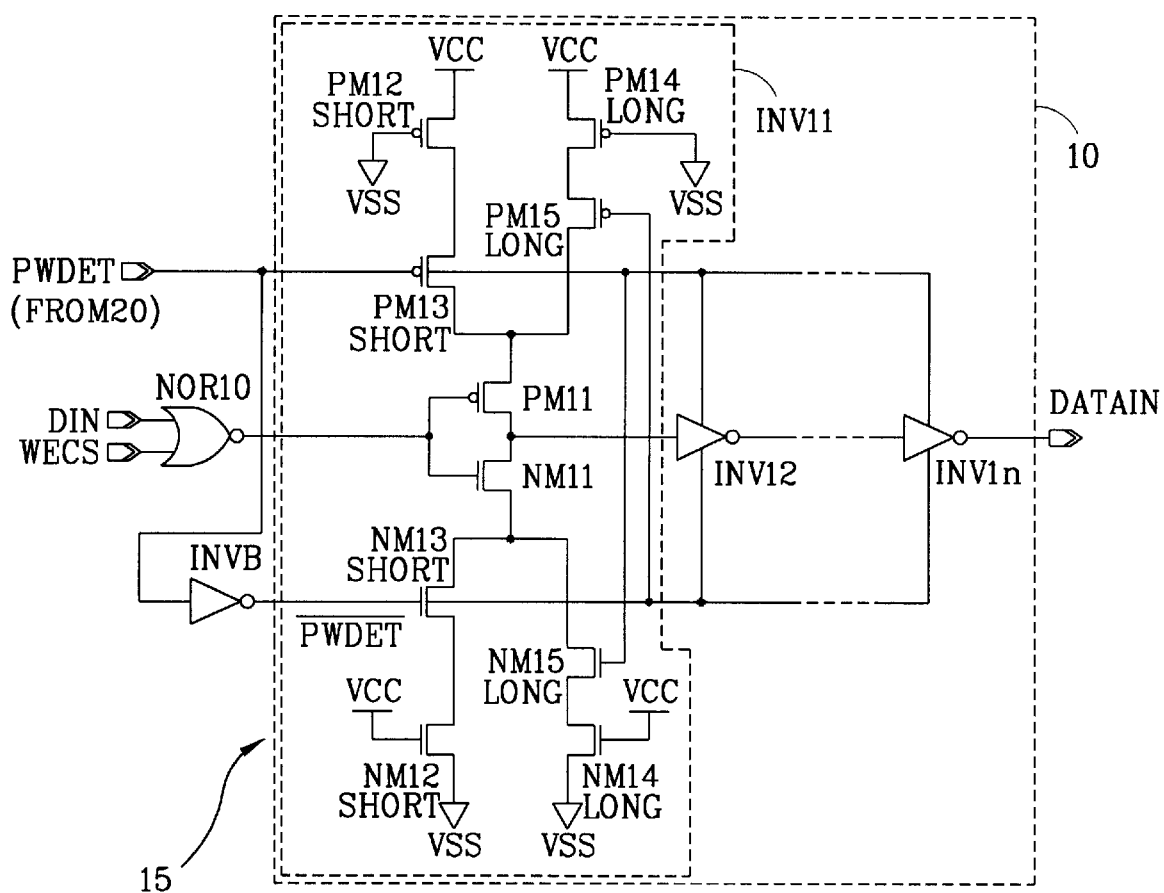
FIG. 3 is a circuit diagram illustrating an input buffer circuit in accordance with the present invention.

FIG. 3 is a circuit diagram illustrating an input buffer circuit 15 in accordance with present invention. Referring to FIG. 3, the input buffer circuit 15 includes: a NOR gate NOR10 NORing a data signal DIN inputted to a data input pad and a control signal WECS into which a write enable signal WE and a chip selection signal CS are combined. The input buffer circuit 15 also includes a delay unit 10 having first to n-th inverters INV11–INV1n to delay an output signal from the NOR gate NOR10. Also included is an external power voltage detection unit 20 detecting whether an external power voltage is high or low; and an inverter INVB inverting an output signal PWDET from the external power voltage detection unit 20. The output signal PWDET indicates whether the external power voltage VCC is high or low.

Here, the first inverter INV11 of the delay unit 10 includes: a first PMOS transistor PM11 and a first NMOS transistor NM11 having their gates commonly connected to form an input terminal receiving an output signal from the NOR gate NOR10, and having their drains commonly connected to form an output terminal. The inverter INV11 also includes a second PMOS transistor PM12 and a third PMOS transistor PM13 connected in series between the external power voltage VCC and, a source of the first PMOS transistor PM11. A gate of the second PMOS transistor PM12 is connected to a ground voltage VSS and a gate of the third PMOS transistor PM13 receives a detection signal PWDET outputted from the external power voltage detection unit 20. The first inverter INV11 also includes a second NMOS transistor NM12 and a third NMOS transistor NM13 connected in series between a source of the first NMOS transistor NM11 and the ground voltage VSS. A gate of the second NMOS transistor NM12 receives the external power voltage VCC and, a gate of the third NMOS transistor NM13 receives an inverted signal/PWDET of the detection signal PWDET. Also included in the first inverter INV11 are a fourth PMOS transistor PM14 and a fifth PMOS transistor PM15 connected in series between the source of the first PMOS transistor PM 11 and the external power voltage VCC. A gate of the fourth PMOS transistor PM14 is connected to the ground voltage VSS and, a gate of the fifth PMOS transistor PM15 receives the inverted signal/PWDET. A fourth NMOS transistor NM14 and a fifth NMOS transistor NM15 are connected in series between the source of the first NMOS transistor NM11 and the ground voltage VSS and, a gate of the fourth NMOS transistor NM14 receives the external power voltage VCC. A gate of the fifth NMOS transistor NM15 receives the detection signal PWDET outputted from the external power voltage detection unit 20.

Here, channels of the second and third PMOS transistors PM12, PM13 and the second and third NMOS transistors NM12, NM13 are short and wide. Channels of the fourth and fifth PMOS transistors PM14, PM15 and the fourth and fifth NMOS transistors NM14, NM15 are long and narrow.

In addition, the gates of the third PMOS transistor PM13, and fifth NMOS transistor NM15 receive the detection signal PWDET outputted from the external power voltage detection unit 20 and the gates of the third NMOS transistor NM13 and fifth PMOS transistor PMOS15 receive the inverted signal/PWDET inverted by the inverter INVB. These transistors serve as switching units selectively switching by whether the external power voltage VCC is high or low.

The second to n-th inverters INV12~INV1n of the delay unit 10 are identically constituted to the first inverter INV11. Each input terminal receives an output signal from a preceding inverter, and each output terminal is connected to an input terminal of a succeeding inverter. An input data DATAIN is outputted from the output terminal of the n-th inverter INV1n.

Figure 4:
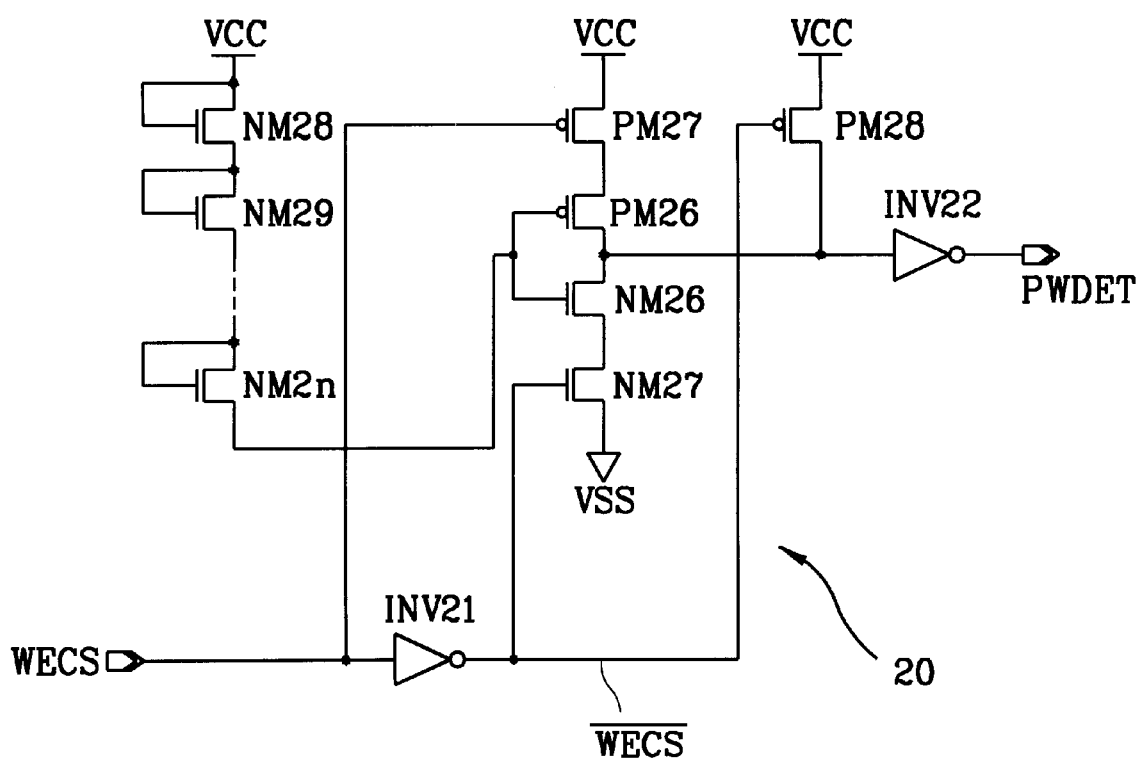
FIG. 4 is a detailed circuit diagram illustrating an external power voltage detection unit for the configuration of FIG. 3.

As illustrated in FIG. 4, the external power voltage detection unit 20 includes: an n+1st inverter INV21 to invert the control signal WECS. The detection unit 20 also includes a sixth PMOS transistor PM26 and a sixth NMOS transistor NM26 connected in series between the external power voltage VCC and the ground voltage VSS. Their gates are commonly connected to form an input terminal, and their drains are commonly connected to form an output terminal. A seventh PMOS transistor PM27 is connected to PM26 and its gate receives the control signal WECS. A seventh NMOS transistor NM27 is connected to NM26 and its gate receives an inverted signal/WECS of the control signal WECS. Eighth to n-th NMOS transistors NM28~NM2n are connected in series between the external power voltage VCC and the input terminal, and have their gates and drains respectively commonly connected. An n+2nd inverter INV22 inverts a voltage of the output terminal, and outputting the detection signal PWDET. An eighth PMOS transistor PM28 has its source connected to receive the external power voltage VCC, its drain connected to the output terminal, and its gate connected to receive the inverted signal/WECS.

Here, the eighth to n-th NMOS transistors NM28~NM2n are used to lower the external power voltage VCC. The number of the NMOS transistors used is determined to lower the voltage to the extent that the sixth PMOS transistor PM26 is turned off and the sixth NMOS transistor NM26 is turned on when the high external power voltage VCCH is applied, and to the extent that the sixth PMOS transistor PM26 is turned on and the sixth NMOS transistor NM26 is turned off when the low external power voltage VCCL is applied. In addition, when the control signal WECS is at a high level, the eighth PMOS transistor PM28 makes the detection signal PWDET a low-level signal, regardless of whether the external power voltage VCC is high or low.

The operation of the input buffer circuit according to the present invention will now be described with reference to the accompanying drawings.

First, when the low external power voltage VCCL is applied, the data signal DIN as shown in FIG. 5A and the control signal WECS as shown in FIG. 5B are combined by the NOR gate NOR10, inputted to and delayed by the delay unit 10, and outputted as the input data DATAIN as shown in FIG. 5D.

Here, the control signal WECS is at a low level as shown in FIG. 5B and the low external power voltage VCCL is inputted. Thus the external power voltage detection unit 20 outputs the low-level detection signal PWDET as shown in FIG. 5C.

Accordingly, the third PMOS transistors PM13 and the third NMOS transistors NM13 of the inverters INV11~INVn of the delay unit 10 are turned on, the fifth PMOS transistors PM15 and the fifth NMOS transistors NM15 thereof are turned off. Thus the inverters INV11~INVn have a long delay. As a result, the data signal DIN inputted to the input pad is outputted as the input data DATAIN, delayed by a first delay width TD1 as shown in FIG. 5D.

The channels of the third and fourth PMOS transistors PM13, PM14 and the third and fourth NMOS transistors NM13, NM14 are short and wide, and thus inverters incorporating these transistors have a long delay.

On the other hand, when the high external power voltage VCCH is applied, the data signal DIN as shown in FIG. 6A and the control signal WECS as shown in FIG. 6B are combined by the NOR gate NOR 10, inputted to and delayed by the delay unit 10, and outputted as the input data DATAIN. Here, the control signal WECS is at a high level as shown in FIG. 6B and the high external power voltage VCCH is inputted. Thus, the external power voltage detection unit 20 outputs the high-level detection signal PWDET as shown in FIG. 6C.

Accordingly, the third PMOS transistors PM13 and the third NMOS transistors NM13 of the inverters INV11~INVn of the delay unit 10 are turned off, the fifth PMOS transistors PM15 and the fifth NMOS transistors NM15 thereof are turned on. Thus, each inverter INV11~INVn of the delay unit 10 has a short delay. As a result, the data signal DIN inputted to the data input pad is outputted as the input data DATAIN delayed by a second delay width TD2, as shown in FIG. 6D.

The channels of the fourth and fifth PMOS transistors PM14, PM15 and the fourth and fifth NMOS transistors NM14, NM15 are long and narrow. Thus the inverters have a short delay.

As described above, when the high external power voltage VCCH is applied, the inverters include the transistors PM14, PM15, NM14, NM15 which have a long and narrow channel far decreasing the delay. To the contrary, when the low external power voltage VCCL is applied, the inverters include the transistors PM12, PM13, NM12, NM13 which have a short and wide channel far increasing the delay. Here, a level of the external power voltage VCC is detected by detection unit 20, and according to the detection result, the inverter having a short or long delay is selectively employed by a switching operation.

The input buffer circuit in accordance with the present invention can obtain a sufficient data hold time and reduce the driving current by using the inverter having the short delay when the high external power voltage VCCH is applied, and can improve an operational speed by using the inverter having the long delay when the low external power voltage VCCL is applied.

Of course, the present invention is not limited to the disclosed embodiment. The present invention includes any delay element, such as another logic gate other than an inverter, having at least two parallel transistors, one of which is selected based on a detected voltage level. The transistors in this alternate embodiment may, but need not, have differing channel geometries in accordance with the operation of the preferred embodiment. The present invention also includes any voltage sensing circuit, when used in conjunction with the above-described delay element. For example, the circuit which generates VCCL and VCCH could also generate a logical signal, to be input to the PWDET terminal, indicating which VCC level had been generated.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalencies of such meets and bounds are therefore intended to be embraced by the appended claims.

What is claimed is:

1. An input buffer circuit comprising:
    a delay unit to delay an input signal, the delay unit being powered by an external power voltage and having an associated variable delay which is varied according to a detection signal and the external power voltage, the detection signal indicating whether the external power voltage is high or low, the delay unit including:
        a plurality of delay elements connected output-to-input so as to form a chain, each delay element having an individual variable delay which is varied according to a detection signal and the external power voltage.

2. The input buffer circuit according to claim 1, further comprising:
    an external power voltage detection unit to detect whether an external power voltage is high or low, and to output the corresponding detection signal.

3. The input buffer circuit according to claim 1, further comprising:
    an inverter having an input connected to the detection signal to output an inverted detection signal.

4. The input buffer circuit according to claim 1, further comprising: a logic gate to provide the input signal from a control signal and a data signal.

5. The input buffer circuit according to claim 3, wherein each delay element in the delay unit includes:
    a first PMOS transistor and a first NMOS transistor with commonly connected gates to form an input terminal, and with commonly connected drains to form an output terminal;
    a second PMOS transistor and a third PMOS transistor connected in parallel between the first PMOS transistor and the external power voltage, and having gates respectively receiving the detection signal and the inverted detection signal; and
    a second NMOS transistor and a third NMOS transistor connected in parallel between the first NMOS transistor and a ground voltage, and having gates respectively receiving the inverted detection signal and the detection signal.

6. The input buffer circuit according to claim 5, wherein when the detection signal is high, the third PMOS transistor and the third NMOS transistor are turned on.

7. The input buffer circuit according to claim 5, wherein when the detection signal is low, the second PMOS transistor and the second NMOS transistor are turned on.

8. The input buffer circuit according to claim 6, wherein both channels of the third PMOS transistor and the third NMOS transistor are long and narrow.

9. The input buffer circuit according to claim 7, wherein both channels of the second PMOS transistor and the second NMOS transistor are short and wide.

10. The input buffer circuit according to claim 1, delay unit including at least two parallel transistors connected to the external power voltage, one of which being turned on at a time in accordance with the detection signal.

11. The input buffer circuit according to claim 2, wherein the external power voltage detection unit comprises:
    a voltage lowering circuit connected to the external power voltage and to output a lowered voltage; and
    a logic circuit having an input of the lowered voltage, and having a decision threshold, to output the detection signal.

12. The input buffer circuit according to claim 11, wherein the voltage lowering circuit includes a plurality of serially connected NMOS transistors.

13. The input buffer circuit according to claim 12, wherein a number of the plurality of NMOS transistors is determined such that a high external power voltage causes the lowered voltage to exceed the decision threshold of the logic circuit, and a low external power voltage causes the lowered voltage not to exceed the decision threshold of the logic circuit.

14. The input buffer circuit according to claim 11, wherein the logic circuit includes:
   a first PMOS transistor and a first NMOS transistor with commonly connected gates to form an input terminal, and with commonly connected drains to form an output terminal; and
   an inverter connected to the output terminal to output the detection signal.

15. The input buffer circuit according to claim 11, the external power voltage detection unit further comprising:
   a control circuit connected to the logic circuit for selectively overriding the logic circuit in response to a control signal.

16. The input buffer circuit according to claim 15, wherein the control circuit includes a transistor to make the detection signal low, regardless of whether the external power voltage is high or low, when the control signal is high.

17. A buffer circuit comprising:
   an external power detection unit for receiving an external voltage and generating a detecting signal; and
   a detection signal inverter for receiving the detection signal and generating an inverted detection signal; and
   a delay unit for delaying the input signal and receiving the detection signal and inverted detection signal, the delay unit including:
      a plurality of inverters connected in series, each inverter having a plurality of first transistors and a plurality of second transistors, each first transistor having channels configured with a first ratio of width to length and each second transistor having channels configured with a second ratio of width to length,
      wherein the first ratio is relatively larger than the second ratio and the differing ratios permit the buffer circuit to generate variable delays.

18. The buffer circuit of claim 17, wherein:
   when the external voltage is relatively high, the plurality of first transistors is activated and provide a relatively long delay, and
   when the external voltage is relatively low, the plurality of second transistors is activated and provides a relatively short delay.

19. The buffer circuit of claim 17, wherein each first transistor has a relatively shorter and relatively wider channel than the channel of each second transistor.

* * * * *